US008146245B2

(12) United States Patent
Chao et al.

(10) Patent No.: US 8,146,245 B2
(45) Date of Patent: Apr. 3, 2012

(54) METHOD FOR ASSEMBLING A WAFER LEVEL TEST PROBE CARD

(75) Inventors: Clinton Chih-Chieh Chao, Hsinchu (TW); Fei-Chieh Yang, Hsin-Chu (TW); Chun-Hsing Chen, Chu-Pei (TW); Mill-Jer Wang, Hsinchu (TW); Sheng-Hsi Huang, Hsinchu (TW); Ming-Cheng Hsu, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 12/787,560

(22) Filed: May 26, 2010

(65) Prior Publication Data

US 2010/0229383 A1 Sep. 16, 2010

Related U.S. Application Data

(62) Division of application No. 12/132,280, filed on Jun. 3, 2008, now Pat. No. 7,750,651.

(60) Provisional application No. 61/034,831, filed on Mar. 7, 2008.

(51) Int. Cl.
*H05K 3/34* (2006.01)
*H05K 3/30* (2006.01)
*H05K 1/16* (2006.01)
*G01R 31/20* (2006.01)

(52) U.S. Cl. ........ 29/840; 29/832; 174/260; 324/754.01

(58) Field of Classification Search ............. 29/832, 29/837–842; 324/754.01, 754.03, 754.13, 324/755.01, 756.03, 757.02, 762.01; 174/260
See application file for complete search history.

(56) References Cited

U.S. PATENT DOCUMENTS

| 6,064,213 | A | * | 5/2000 | Khandros et al. | 324/750.05 |
|---|---|---|---|---|---|
| 6,079,987 | A | * | 6/2000 | Matsunaga et al. | 439/66 |
| 6,242,929 | B1 | * | 6/2001 | Mizuta | 324/754.07 |
| 6,246,245 | B1 | * | 6/2001 | Akram et al. | 324/756.03 |
| 6,356,098 | B1 | * | 3/2002 | Akram et al. | 324/750.19 |
| 6,366,112 | B1 | * | 4/2002 | Doherty et al. | 324/754.18 |
| 6,410,990 | B2 | * | 6/2002 | Taylor et al. | 257/786 |
| 6,600,334 | B1 | * | 7/2003 | Hembree et al. | 324/754.14 |
| 6,791,347 | B2 | * | 9/2004 | Ishizaka et al. | 324/750.05 |
| 7,323,712 | B2 | * | 1/2008 | Kokubo et al. | 257/48 |
| 7,345,492 | B2 | * | 3/2008 | Kister | 324/756.03 |
| 7,368,927 | B2 | * | 5/2008 | Smith et al. | 324/754.07 |
| 7,409,762 | B2 | * | 8/2008 | Kirby | 29/842 |
| 7,429,497 | B2 | * | 9/2008 | Stone | 438/106 |
| 2006/0022688 | A1 | * | 2/2006 | Giga et al. | 324/754 |
| 2007/0182433 | A1 | * | 8/2007 | Natsuhara et al. | 324/760 |
| 2008/0211525 | A1 | * | 9/2008 | Garabedian et al. | 324/758 |

\* cited by examiner

*Primary Examiner* — David Angwin
(74) *Attorney, Agent, or Firm* — Duane Morris LLP; Frank J. Spanitz

(57) ABSTRACT

A method for assembling a probe card for wafer level testing of a plurality of semiconductor devices simultaneously is disclosed. The probe card may include a circuit board including wafer level testing circuitry, a partially flexible silicon substrate, a plurality of test probes disposed at least partially in the substrate for engaging a plurality of corresponding electrical contacts in a wafer under test, and a compressible underfill coupling the substrate to the circuit board. The method includes aligning and assembling the foregoing components, and curing the underfill. The probe card may be used for wafer level burn-in testing. In some embodiments, the probe card may include active test control circuitry embedded in the silicon substrate for conducting wafer level high frequency testing.

20 Claims, 6 Drawing Sheets

METHOD FOR ASSEMBLING A WAFER LEVEL TEST PROBE CARD

CROSS-REFERENCE TO RELATED APPLICATIONS

This is a divisional application of U.S. application Ser. No. 12/132,280 filed Jun. 3, 2008 which is a U.S. non-provisional application claiming the benefit of U.S. provisional patent application Ser. No. 61/034,831 filed on Mar. 7, 2008, the entire disclosures of which are incorporated herein by reference.

FIELD OF THE INVENTION

The present invention generally relates to semiconductors, and more particularly to probes cards for testing integrated circuits formed on a semiconductor wafer.

BACKGROUND

Modern semiconductor fabrication involves numerous steps including photolithography, material deposition, and etching to form a plurality of individual semiconductor devices or integrated circuit chips (dice) on a single semiconductor silicon wafer. Typical semiconductor wafers produced today may be at least about 6 inches or more in diameter, with a 12 inch diameter wafer being one common size. Some of the individual chips formed on the wafer, however, may have defects due to variances and problems that may arise during the intricate semiconductor fabrication process. Prior to wafer dicing wherein the individual integrated circuit chips (dies) are separated from the semiconductor wafer, electrical performance and reliability tests are performed on a plurality of chips simultaneously by energizing them for a predetermined period of time (i.e., wafer level burn-in testing). These tests may typically include LVS (layout versus schematic) verification, IDDq testing, etc. The resulting electrical signals generated from each chip or DUT (device under test) are captured and analyzed by automatic test equipment (ATE) having test circuitry to determine if a chip has a defect.

To facilitate wafer level burn-in testing and electrical signal capture from numerous chips on the wafer at the same time, DUT boards or probe cards as they are commonly known in the art are used. Probe cards are essentially printed circuit boards (PCBs) that contain a plurality of metallic electrical probes that mate with a plurality of corresponding electrical contacts or terminal formed on the wafer for the semiconductor chips. Each chip or die has a plurality of contacts or terminals itself which must each be accessed for testing. A typical wafer level test will therefore require that electrical connection be made between well over 1,000 chip contacts or terminals and the ATE test circuitry. Accordingly, precisely aligning the multitude of probe card contacts with chip contacts on the wafer and forming sound electrical connections is important for conducting accurate wafer level testing. Probe cards are typically mounted in the ATE and serve as an interface between the chips or DUTs and the test head of the ATE.

It is preferable to test all of the chips on an entire semiconductor wafer at one time in parallel for efficiency and to minimize chip production time. Ideally, therefore, it is desirable to move the probe card (and testing probes thereon) into physical engagement or contact with the surface of the wafer ("touch down") only once and to test the entire wafer at one time. To accomplish this requires that precise and complete electrical contact be established during the initial touch down between all of the probe card contacts and corresponding chip contacts. However, limitations with existing probe cards and probes sometimes may prevent proper mating of contacts on the wafer and probe card on the first try. This requires multiple engagements or touch downs between the probe card and wafer in order to successfully mate all of the probe card and chip contacts, which reduces testing efficiency and increases chip production time and costs.

Referring to FIG. 1A, one type of known probe card uses a plurality of electrical probe contacts in the form of cantilevered metallic curved spring fingers that mate with corresponding contacts on the wafer to establish sufficient stylus or contact pressure therebetween for accurate testing. The flexible fingers are relatively thin and have a fixed end mounted on a rigid ceramic substrate which is then coupled to a printed circuit board (PCB). The contact fingers are oriented generally parallel to the surface of the probe card where attached to the card and then gradually curve upwards towards vertical near the free ends of the fingers that physically engage the electrical contacts on the wafer. The fingers will flex and tend towards straightening out when compressed against the wafer contacts to absorb the contact stress resulting from forcing the probe card into engagement with the wafer. Ideally, the free ends of the fingers will all lie in the same preferably flat imaginary plane to provide proper contact or stylus pressure between the probe card fingers and chip electrical contacts on the surface of the wafer. With repetitive use and handling over time, however, the free ends of some of the fingers may become misaligned due to physical damage and thermal and mechanical fatigue. Therefore, some of fingers will not be coplanar any longer with the other fingers. While this may not be problematic for testing single dies or multiple dies on small portions of an entire wafer, non-planar probe fingers may result in inadequate contact and stylus pressure between all probe card and wafer contacts when an entire wafer and plurality of dies thereon are tested at a single time. This may prevent obtaining accurate electrical test data for all of the dies or chips on the entire wafer at once. Therefore, multiple touch downs between the probe card and wafer may therefore be required to complete wafer level burn-in testing. In addition, the non-planar probe finger problem also limits the size of the entire wafer that can be tested in a single touch down because the planar misalignment of the fingers becomes magnified as the probe card becomes increasingly larger.

Referring to FIG. 1B, another type of known probe card uses a plurality of electrical probe contacts in the form of substantially vertical metallic needles each having a fixed upper end attached to a rigid upper substrate (coupled then to a PCB) and a free floating lower end that extends through a hole in a rigid lower ceramic substrate spaced apart from the upper substrate. The floating lower end of the needle engages the chip electrical contacts or electrodes on the surface of the wafer. The needles may be shaped with a slight bulge between the ends to add some flexibility for establishing sufficient stylus pressure and to absorb the contact stress resulting from forcing the probe card into engagement with the wafer without breaking the thin needles. With repetitive use, needle co-planarity problems may develop over time similar to the spring finger type probes discussed above resulting in problems with testing all dies on an entire wafer at once. Accordingly, an improved testing probe card with electrical contacts is desired for wafer level testing.

SUMMARY

A testing probe card suitable for wafer level testing is provided that overcomes the deficiencies of the foregoing known testing probe card designs. The probe card may be used for wafer level burn-in testing according to one embodiment described herein. Wherein the prior art included highly flexible probes supported by a rigid structure, the preferred embodiment includes probe contacts that are more structurally rigid than prior designs and better supported by a support structure that preferably is at least partially flexible for assisting in absorbing contact stresses and creating adequate stylus pressure. The more flexible probe support structure also advantageously better compensates for any non-planarity problems due to its ability to be conform to the wafer surface. Rigid probes according to principles of the present invention, which in some embodiments may be constructed using MEMS and semiconductor fabrication technology, may control probe co-planarity to within +/−2 microns in contrast to prior probe needles which may have a co-planarity variance of about 75 microns.

Advantageously, the preferred probes and support structure describe herein more widely distributes contact stresses and forces throughout the support structure in lieu of concentrating the stresses in the probe contacts themselves leading to problems in the prior designs. Accordingly, probe contacts according to principles of the present invention are more durable and less susceptible to damage or bending with repetitive use to minimize the problem of non-planar probe tips. For wafer level testing, this allows the probe card to be properly positioned and engaged with the entire wafer with a single touch down or engagement between the card and wafer in lieu of multiple attempts as experienced with past probe cards. In one embodiment, a majority of the length of the probe other than the exposed probe tip is substantially supported between the ends by the probe contact support structure described herein. By contrast, the foregoing prior probe cards provide essentially no support near the middle portions of the highly flexible probe needles or fingers as shown in FIGS. 1A and 1B.

In one embodiment, a probe card for wafer level testing a plurality of semiconductor devices simultaneously is provided. The probe card includes a circuit board including wafer level testing circuitry, a partially flexible silicon substrate which may be a silicon membrane in some embodiments, a plurality of metallic test probes disposed at least partially in and supported by the substrate for engaging a plurality of corresponding electrical contacts in a wafer under test, and a compressible underfill coupling the substrate to the circuit board. Preferably, the test probes are rigid and not freely bendable. In one embodiment, each test probe includes a metal-filled via formed in the silicon substrate or membrane and a probe tip connected to the via and extending outwards from a lower surface of the membrane to engage a corresponding electrical contact in a wafer under test. The silicon substrate or membrane and underfill at least partially absorb contact stress from engaging the wafer under test with the probe card for conducting wafer level testing. In some embodiments, the test probes are preferably supporting for at least a majority of their entire length, and more preferably substantially all of their entire length, by the silicon substrate or membrane.

In some embodiments, the underfill may be selected from the group consisting of a flexible gel, epoxy resin, and silicon rubber. In one embodiment, the probe card may be used for wafer level burn-in testing. In another embodiment, the probe card includes active test control circuitry embedded in the silicon substrate and may be used for conducting wafer level high frequency testing, such as known good die (KGD) final wafer testing.

A method for assembling a testing probe card for wafer level testing is also provided.

BRIEF DESCRIPTION OF THE DRAWINGS

The features of the preferred embodiments will be described with reference to the following drawings where like elements are labeled similarly, and in which.

Figure 1A:
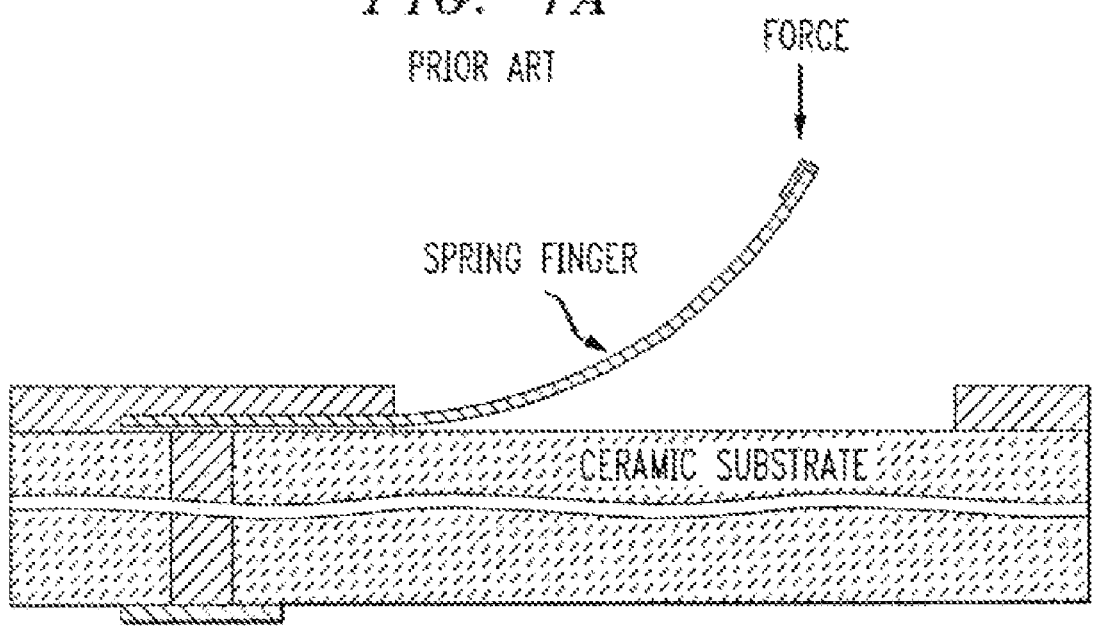
FIGS. 1A and 1B shows conventional known conductive test probe designs.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

As the term is used herein in describing metallic test probes and tips or needles, rigid shall have its customary meaning of a structure that is generally deficient in or devoid of flexibility.

Figure 3:
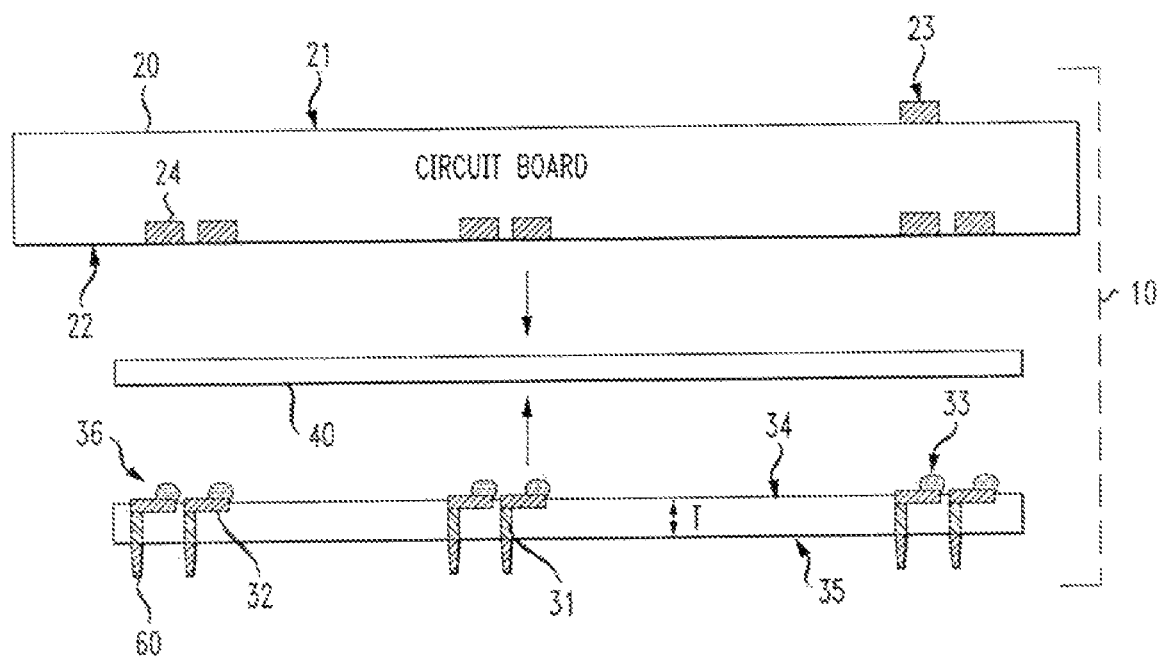
FIG. 3 is an exploded cross-sectional side view of a testing probe card incorporating the test probe of FIG. 2 prior to assembly.
Figure 4:
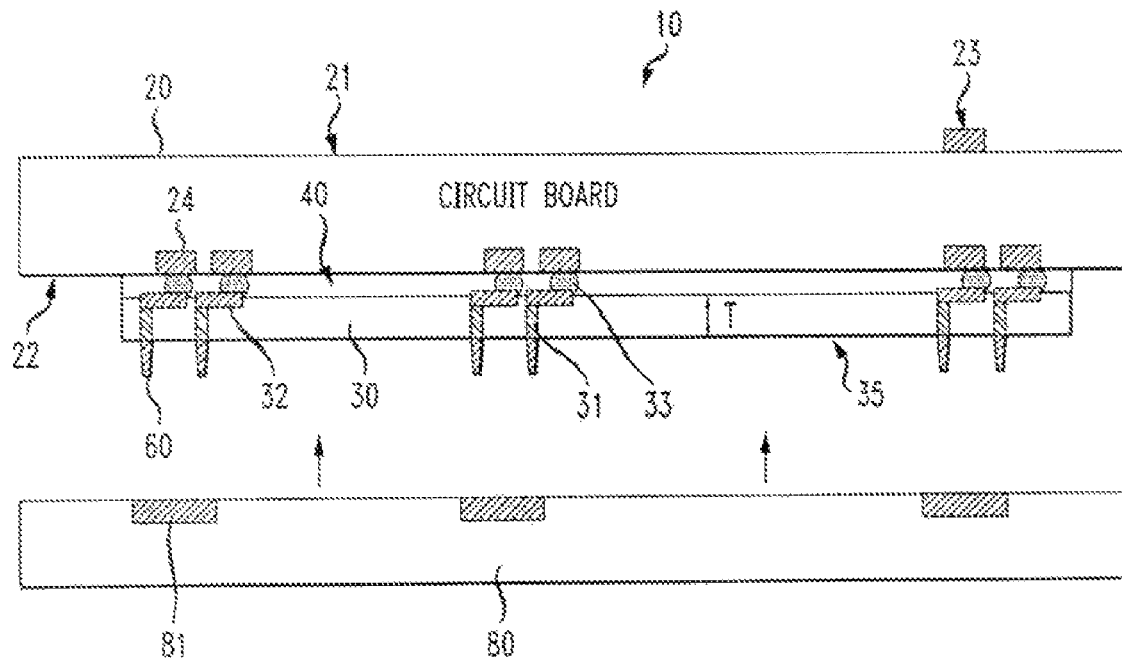
FIG. 4 is a cross-sectional side view of testing probe card of FIG. 3 after assembly.

A first exemplary embodiment of a probe card according to principles of the present invention is illustrated in FIGS. 3 and 4. Probe card 10 includes a printed circuit board 20 (PCB) having top and bottom surfaces 21, 22, respectively. Top surface 21 includes an array of electrical contacts 23 for mating with corresponding contacts on the automatic test equipment (ATE) (not shown) for performing wafer level burn-in testing. In one embodiment, circuit board 20 may be made of silicon. Circuit board 20 includes wafer testing circuitry that is operative to apply an electrical load to silicon wafer 50 (see FIG. 8) and to receive and process return electrical signals from the wafer for conducting wafer level burn-in performance and reliability tests that are conducted on DUTs in a semiconductor wafer.

With continuing reference to FIGS. 3 and 4, probe card 10 further includes a silicon-based substrate such as wafer-level silicon membrane 30 for supporting a plurality of test probes 60. Silicon membrane 30 is coupled to the bottom surface 22 of circuit board 20, and includes top and bottom surfaces 34, 35, respectively. Silicon membrane 30 preferably is a relatively thin and at least partially flexible structure to absorb at least some of the contact stresses associated with forcing the wafer 50 (see FIG. 8) under test into contact with testing probe card 10, and to at least partially conform to the surface of the wafer under test to compensate for any non-coplanar probe misalignment problems. Silicon membrane 30 preferably may be about 50-500 microns in thickness T in some embodiments, and in one preferred representative embodiment may be about 175 microns in thickness T. In one embodiment, silicon membrane 30 preferably is formed in the same manner as any other semiconductor wafer which may include process steps such as photolithography, material deposition, and etching to create various surface and embedded features and components in the membrane as further described herein.

In a preferred embodiment, silicon membrane 30 is coupled to circuit board 20 with a flexible and compressible underfill 40 interposed between the circuit board and membrane. Underfill 40 forms a layer that preferably covers at least part of lower surface 22 of circuit board 20, and more preferably covers the majority of lower surface 22. In some embodiments, underfill 40 may be a commercially available flexible gel, epoxy resin, or silicon rubber. In one possible embodiment, underfill 40 may be a flexible liquid epoxy resin such as Sumiresin Excel CRP-4160 Series available from Sumitomo Bakelite Co., Ltd. Flexible underfill 40 absorbs contact stresses resulting from forcing probe card 10 into contact with silicon wafer 50 which contains a plurality of DUTs 51 requiring wafer level burn-in testing (see FIG. 8). In one representative embodiment without limitation, underfill 40 may be about 300 microns in thickness.

Figure 2:
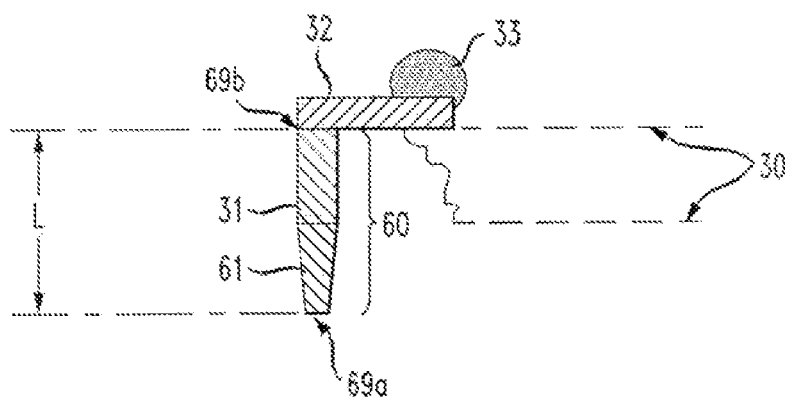
FIG. 2 is a cross-sectional side view of one embodiment of a conductive test probe according to principles of the present invention.

With reference to FIGS. 2-4, silicon membrane 30 includes a plurality of metallic probes 60 (best shown in FIG. 2). Probes 60 provide electrical contacts and form conductive paths for electrically connecting circuit board 20 with the DUTs 51 in wafer 50 (see FIG. 8) for wafer level burn-in testing. Each probe 60 is defined by a metallic probe tip 61 and a conventional semiconductor metallic via 31 connected thereto as shown in FIG. 2. Vias 31 are preferably formed in silicon membrane 30 by conventional etching and material deposition techniques used in fabricating semiconductors in silicon wafers. Vias 31 preferably extend at least partially through the thickness T of membrane 30 and serve to transfer electrical test signals through the silicon membrane 30 both to and from circuit board 20 for testing wafer 50. Probe tip 61 may be attached to one end of via 31 using any conventional method. Probe tips 61 preferably project outwards from bottom surface 35 of silicon membrane 30, which includes a plurality of probe tips 61 that preferably are arranged to mate with a plurality of complementary positioned DUT contacts 52 on wafer 50 (see FIG. 8). As shown in FIGS. 2-4, testing probes 60 are preferably supported between the ends 69a and 69b, and more preferably for substantially their entire length L by silicon membrane 30 to prevent non-planarity of the probe tips 60 and breakage during repetitive use and thermal cycles from applying an electrical load to wafers being tested.

In one embodiment, with continuing reference to FIGS. 2-4, wafer-level packaging (WLP) using conventional redistribution layer and bump technology may be employed to form external electrical interconnections on top surface 34 of membrane 30. The WLP includes patterned thin-film metal redistribution conductors 32 and a surface-mounted ball grid array (BGA) 36 that forms a patterned interconnection system between each probe tip 61 on silicon membrane 30 and electrical contacts or pads 24 on circuit board 20. In some embodiments, redistribution conductors 32 may be copper. Preferably, redistribution conductors 32 may be formed and patterned on top surface 34 of silicon membrane 30 by conventional semiconductor fabrication processes used when forming the silicon membrane including photolithography, thin layer material deposition, and etching. BGA 36 includes an array of solder balls 33 ("bumps") as shown, which are attached to the redistribution conductors 32 and mate with electrical pads 24 on circuit board 20. In one embodiment, circuit board contacts 24 may be copper. Probe tips 61 are electrically coupled to redistribution conductors 32 in one embodiment by the plurality of semiconductor through-silicon metallic vias 31 extending at least partially through membrane 30. In one possible embodiment, vias 31 may be made of tungsten, however, other conductive metals or combination of metals may be used.

Although WLP using conventional redistribution layer and bump technology is used in the preferred embodiment, in some embodiments other WLP technologies may alternatively be used.

A preferred method of assembling probe card 10 will now be described with reference to FIGS. 3 and 4. In one embodiment, probe card 10 may be assembled using an SMT (surface mount technology) machine. SMT machines are typically used to mount semiconductor devices onto the surface of PCBs. The process begins by temporarily attaching a glass wafer 80 to bottom surface 35 of silicon membrane 30. Because silicon membrane 30 is relatively thin and flexible, the membrane requires proper support during the probe card assembly to avoid damage. Glass wafer 80 includes recesses 81 which are configured to fit around an individual probe tip 60 or a group of probe tips depending on the pitch or spacing of the probe tips. Recesses 81 may be formed by wet or dry etching in some embodiments. In one embodiment, glass wafer 80 may be releasably attached to silicon membrane 30 using UV tape to temporarily bond the two components together. The SMT machine may include a robot capable of applying a vacuum which may be used to hold glass wafer 80 and attached the glass wafer to silicon membrane 30. It is clarified that glass wafer 80 is preferably used only for assembling the probe card, and is subsequently removed after assembly for wafer level testing.

Continuing with reference to FIGS. 3 and 4, the preferred probe card assembly process continues by forming a BGA 36 on top surface 34 of silicon membrane 30. This step includes depositing the solder balls 33 onto the redistribution conductors 32 previously formed on top surface 34 of silicon membrane 30 by conventional semiconductor wafer fabrication techniques including etching and material deposition. Solder balls 33 may preferably be formed using the SMT machine. Silicon membrane 30 is beneficially supported by glass wafer 80 during the solder deposition process due to the thinness of the member. After the BGA 36 is formed, the top surface 34 of silicon membrane 30 is ultrasonically cleaned in preparation for applying the underfill 40 to the top surface. Underfill 40 may then be applied to top surface 34 of silicon membrane 30.

With continuing reference to FIGS. 3 and 4, membrane 30 is next aligned with and pressed against circuit board 20 using the SMT machine, preferably mating each solder ball 33 with a corresponding conducting pad 24 previously formed on the circuit board using conventional semiconductor fabrication techniques. It should be noted that in other possible embodiments, underfill 40 may be inserted between the membrane 30 and circuit board 20 after the two components are pressed together. In either case, underfill 40 is then cured using UV light. In the process, the UV light will act to also release the UV tape while curing the underfill and the glass wafer 80 is then removed after the curing process. The assembly is moved to a reflow soldering oven and heated to melt the solder balls 33 using any suitable heat source such as hot gas, infrared heat, etc. The melted solder flows and creates an electrical connection to pads 24 on circuit board 24. This results in the fabricated probe card 10 assembly shown in FIG. 4. Using the foregoing probe card construction, probes 60 and particularly the probe tips 61 are advantageously well supported by silicon membrane 30 and underfill 40. Unlike the foregoing and largely unsupported prior art probe needles or fingers, probe 60 is relatively rigid yet has sufficient flexibility due to the flexible membrane 30 and underfill 40 to withstand contact stresses from repetitively forcing probe card 10 into wafer 50 for burn-in testing. Accordingly, probes are less susceptible to damage and non-planar experienced by prior probes. In addition, the rigid yet somewhat flexible probe assembly permits the proper stylus pressure to be applied between the probe card and wafer contacts for establishing reliable electrical connections.

Figure 5:
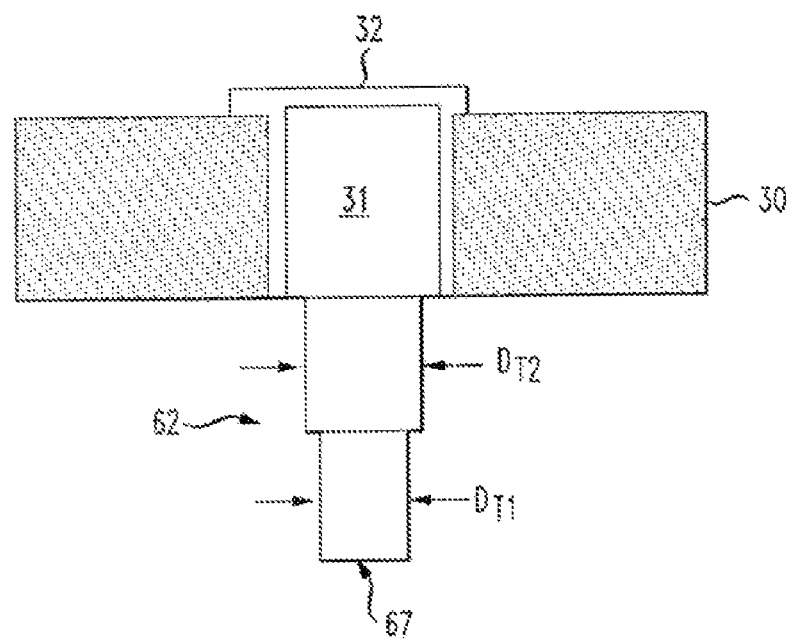
FIG. 5 is a side view of a first embodiment of a probe tip usable with the test probe of FIG. 2.
Figure 6A:
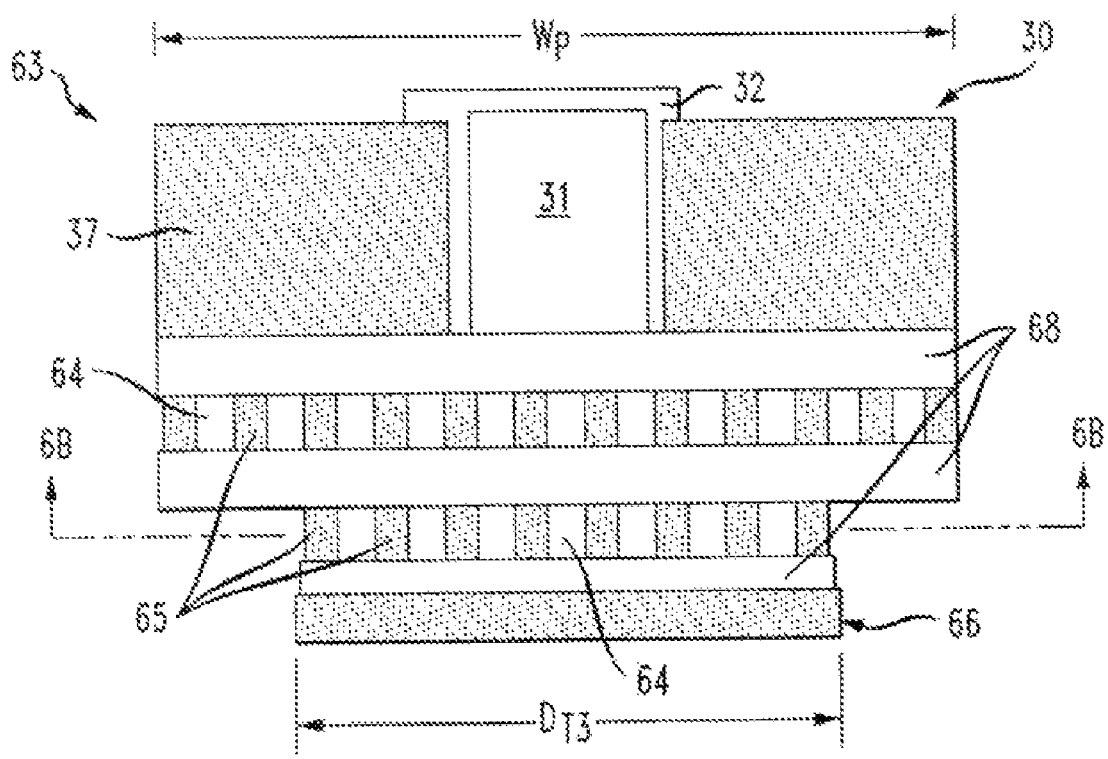
FIG. 6A is a cross-sectional side view of a second embodiment of a probe tip usable with the test probe of FIG. 2.

Referring now to FIGS. 5 and 6A&B, two possible embodiments of probe tips 62 are shown. The probe tips shown may be connected to vias 31 by any conventional method as will be known to those skilled in the art. FIG. 5 illustrates a solid metal probe tip 62 having a somewhat pin-like configuration allowing for close pitch spacing of the tips and a contact surface 67 for contacting corresponding DUT contact pads for testing. In some embodiments, probe tips 62 may be made of tungsten or NiCo. Other suitable conductive metals, however, may be used. Probe tip 62 may have any suitable configuration, and in some possible embodiments may have a stepped configuration as depicted. In one representative embodiment, metal probe tip 62 may have a lower portion with a diameter $D_{T1}$ at its smallest extremity that engages contact pads on the DUT of about 12 microns and an upper portion with diameter $D_{T2}$ that connects to via 31 of about 50 microns.

Figure 6B:
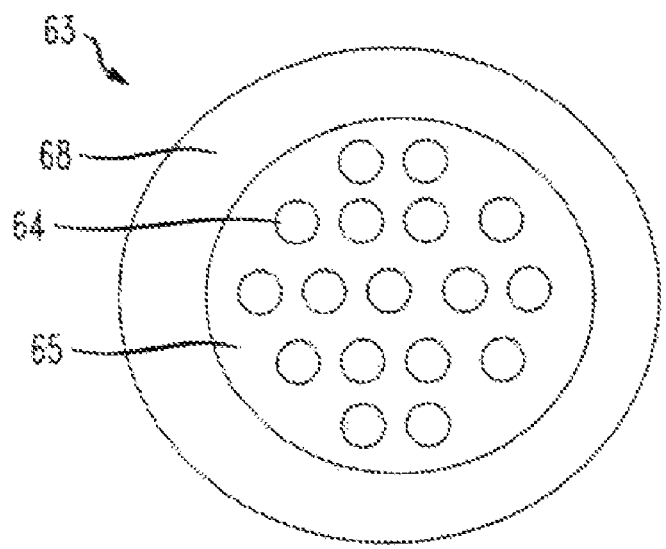
FIG. 6B is a partial cross-sectional side view of the probe tip of FIG. 6A taken along line 6B-6B in FIG. 6A.

FIGS. 6A and 6B illustrate a cross-section through an array-type probe tip 63 which may be used with probe card 10. In one embodiment, array probe tip 63 may be formed from a silicon substrate 65 having a plurality of conductive metal structures formed and arranged therein. In one embodiment, substrate 65 may be silicon oxide; however, other suitable substrate materials may be used so long as the material selected may be processed and etched via conventional semiconductor fabrication techniques. Array probe tip 63 is preferably formed using conventional MEMS or wafer processing photolithography, material deposition, and etching techniques, and preferably may be formed during the same process used to fabricate silicon membrane 30 described herein. In one possible embodiment, array probe tip 63 has a combination grid-like (see cross-section FIG. 6B) and multi-layered structure formed from a combination of alternating layers of (1) silicon 65 with metallic vertical probe tip vias 64 interspersed therein and (2) horizontal metallic spacer layers 68 electrically connected to opposite ends of the vias 64. Preferably, probe tip 63 is formed from at least one silicon layer 65 with metallic vias 64 interspersed therein and a metallic spacer layer 68 disposed on either side of the silicon layer.

Referring to FIGS. 6A and 6B, in some embodiments, probe tip vias 64 and metallic spacer layers 68 be made of the same or different types of metal or metal alloys, which in some embodiments may be copper, aluminum-copper (AlCu) alloy, nickel, Ni—Co, or tungsten. In one possible exemplary embodiment, metallic spacer layers 68 may be made of aluminum-copper and probe tip vias 64 may be made of tungsten. In other possible embodiments, the probe tip vias 64 and spacer layers 68 may be made of the same metal as vias 31 formed in silicon membrane 30 to facilitate the fabrication depending on the type of metal currently used in the semiconductor fabrication machine and to preclude differential thermal expansion or galvanic activity. Accordingly, the invention is not limited by the types of materials and combinations thereof that may be selected. In a preferred embodiment, the external bottom surface of the lowermost metallic spacer layer 68 may be plated or sputtered with a contact layer 66 of Rhenium for enhanced corrosion resistance. Contact layer 66 forms an active contact surface that mates with electrical contact pads on the DUTs.

Figure 7:
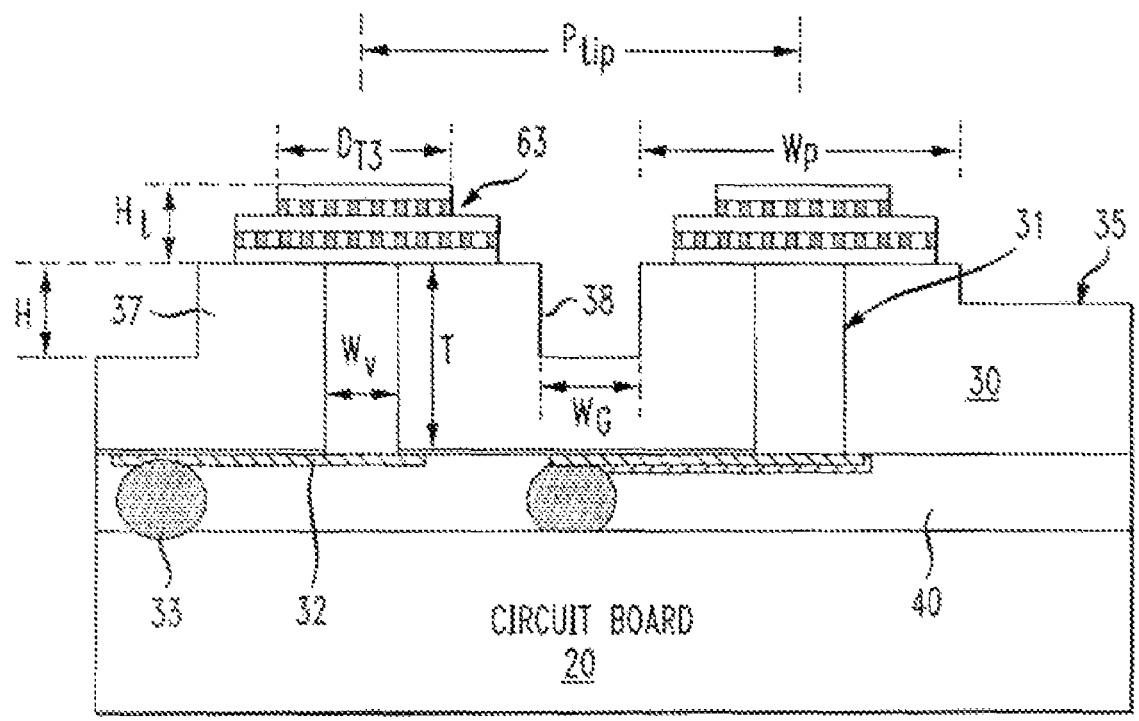
FIG. 7 is cross-sectional side view of an alternative embodiment of testing probe card of FIGS. 3 and 4 with a test probe having the probe tip of FIGS. 6A and 6B.

An exemplary method for making array probe tip 63 using conventional MEMS or wafer processing techniques will be briefly described with reference to FIGS. 6A and 6B. Silicon membrane 30 is formed in the manner described herein, preferably with plateaus 37 as shown in FIG. 7. A first metallic spacer layer 68 may be deposited on plateaus 37 by sputtering or any other suitable conventional deposition technique. First spacer layer 68 creates a conductive path with via 31 (having width Wv, FIG. 7) in silicon substrate 30 as shown. A first silicon substrate 65 for array probe tip 63 is then deposited or otherwise formed on the first spacer layer 68, which in some embodiments may be silicon oxide. A plurality of holes or recesses for forming probe tip vias 64 are next dry etched or otherwise formed in substrate 65 (see, e.g. FIG. 6B). Metal for probe tip vias 64 is next deposited by any suitable means in the holes prepared in substrate 65 to form the metal vias 64. Any overflow metal material from forming vias 64 lying on the exposed surface of first silicon substrate 65 may be removed by CMP or any other suitable technique. A second spacer layer 68 may next be formed on first silicon substrate 65, thereby sandwiching the silicon substrate between the first and second metal spacer layers 68 on either side as shown. The process may be ended here if the desired probe tip diameter $D_{T3}$ and height Ht (see FIG. 7) has been formed. Optionally, if a higher and/or small probe tip diameter is desired, successive layers of metal spacer layers 68 and probe tip silicon substrates 65 may be formed in the previously described manner. In a preferred embodiment shown of a probe tip 63 having a stepped shape for strength and reduced contact pad size, at least one additional layer of a second silicon substrate 65 followed by a third metal spacer layer 68 may be formed in the previous manner. Preferably, in some embodiments, the third spacer layer which will make an electrical connection to contact pads on the DUT is plated or sputtered with Rhenium to form a contact layer 66. In other embodiments, the contact layer 66 may be omitted depending on the corrosion resistance and conductive properties of the metal selected for the spacer layers 68.

FIG. 7 shows one alternative exemplary embodiment of a probe card 10 having array probe tips 63. The probe card is shown inverted from the position shown in FIG. 4. Referring to FIG. 7, probe tips 63 may be disposed on plateaus 37 formed on surface 35 of silicon membrane 30 to project probe tips 63 outwards farther from surface for making interconnection to the DUT contacts 52 (see, e.g., FIG. 8) on wafer 50. Plateaus 37 serve to fully support probe tip 63 to prevent damage with repetitive use and non-planarity of the tips, while still giving the probe tips a longer reach if desired. Since in a preferred embodiment silicon membrane 30 is formed using traditional semiconductor wafer fabrication techniques, plateaus 37 can be readily and efficiently be formed at the same time when the membrane is fabricated. The plateaus 37 may have any suitable height depending on the application requirements. In one representative embodiment without limitation, plateaus 37 may have a height H of about 30 to 60 microns and a width Wp of about 40-50 microns In one representative embodiment without limitation, probe tips 63 may have a fine pitch Ptip of about 20 to 50 microns. However, smaller or larger pitch spacing Ptip may also be used depending on the application requirements. In one representative embodiment, the portion of probe tip 63 that contacts the chip electrical contacts or pads may have a representative tip diameter $D_{T3}$ without limitation of about 10 to 12 microns. However, other probe tip diameters or widths (if tip 63 is not round) smaller or larger than this range may be used depending on the corresponding pitch spacing of DUT contacts 52 on the wafer 50. The trenches 38 formed around plateaus 37 in silicon membrane 30 may have a representative width $W_G$ in some embodiments without limitation of about 10 microns.

Figure 1B:
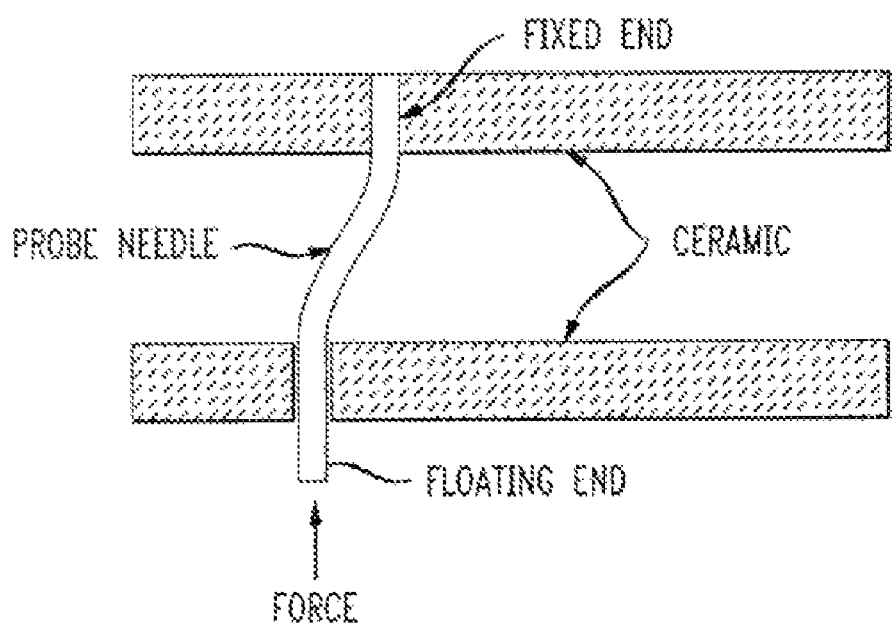

According to another aspect of the invention, a probe card 10 suitable for high frequency known good die (KGD) final testing at the wafer level is provided. Heretofore, KGD testing was typically performed on individual chips or dies after dicing the wafer. Prior known probe cards were incapable of supporting high frequency testing due to the relatively long length of the probe needles/fingers and long distances between the ATE testing circuitry and tips of probes. For example, prior probe needles as shown in FIG. 1B have a typical length of about 5 mm (i.e. 5,000 microns) and can only perform around 1 GHz. For KGD final testing, the testing and related circuitry needs to be closely coupled to the probe tips (and DUTs) to meet the 50 ohm testing specification for high frequency final testing. Since the portion of probe card 10 containing the probes and the structures therein are made in a silicon membrane 30 (instead of ceramic like in prior known probe cards) by conventional wafer processing techniques, the wafer testing circuitry and related components necessary for performing high frequency KGD testing can advantageously be incorporated into the silicon membrane during its fabrication. Therefore, the testing components and circuitry can be closely coupled to the probe tips and DUTs necessary for KGD testing. In some representative embodiments, for example, vias 31 in silicon membrane 30 may have a length of about 200 microns and can perform at higher frequencies around 10 GHz in contrast to prior probe needles.

Figure 8:
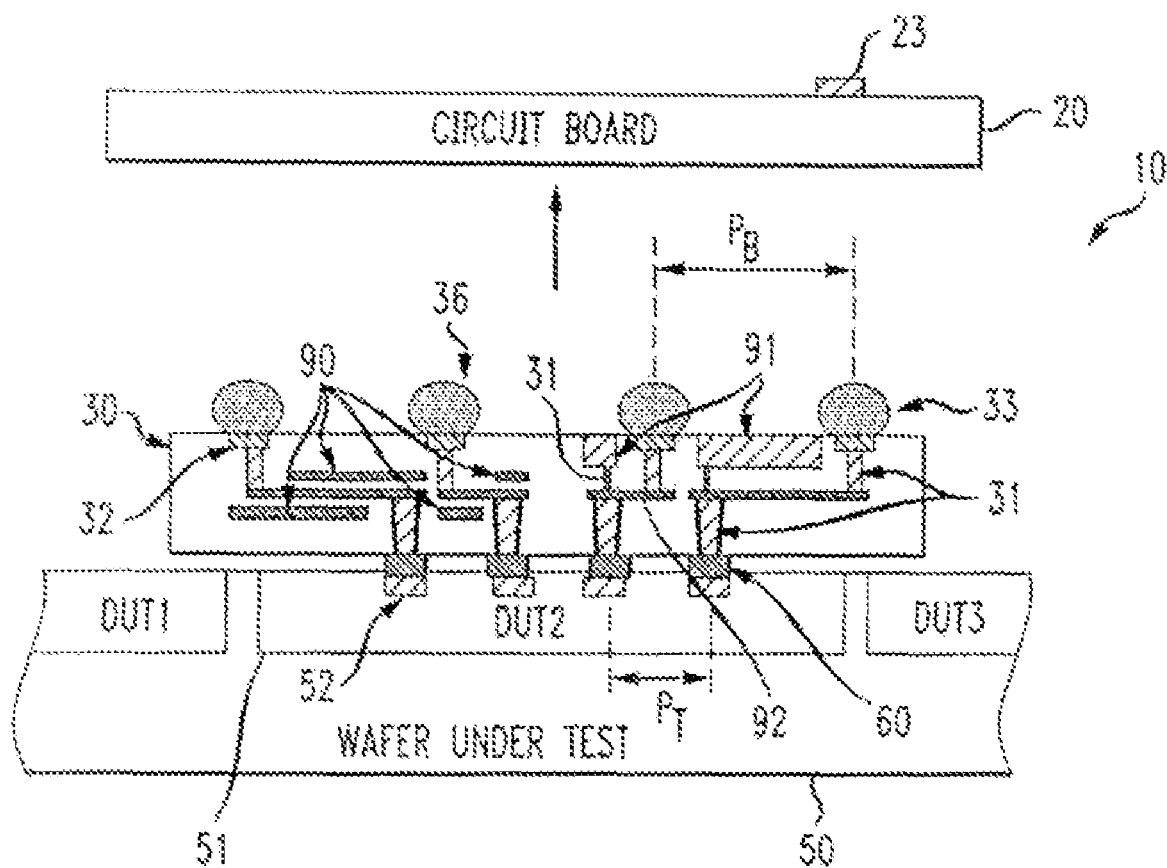
FIG. 8 is a cross-sectional side view of an alternative embodiment of the testing probe card of FIGS. 3 and 4 for high frequency wafer level testing.

FIG. 8 shows one embodiment of a probe card incorporating closely coupled high frequency final testing circuitry and components suitable for KGD testing at the wafer level before dicing. Silicon membrane 30 includes active test control circuitry 91 embedded in the membrane, which may include in some embodiments ESD (electrostatic discharge) protection, RLC components, buffers, amplifiers, and any other IC components required for high frequency testing. To meet the 50 ohm specifications for testing, impedance control structures 90 may be incorporated into silicon membrane 30 for controlled impedance of traces. The type of impedance control structures that may be included and required will be well within the knowledge and abilities of those skilled in the art of high frequency testing of IC components to readily determine. In addition to the WLP components and vias 31 previously described herein with reference to FIGS. 3 and 4, trenches 92 filled with metal conductors as used in conventional semiconductor wafer fabrication processes may be provided to form patterned electrical interconnections within silicon membrane 30 as needed and shown to electrically connect various components.

According to the embodiment shown in FIG. 8, a probe card 10 according to principles of the present invention may further be provided with variable pitch spacing between the test probe tips 60 on the bottom surface 35 of silicon membrane 30 and solder bumps or balls 33 (i.e. contacts) on the top surface 34 of the silicon membrane. In one possible embodiment as shown, the probe tips 60 may have a fine pitch Ptip (i.e. spacing between the tips) to mate with corresponding DUT contacts in the wafer 50 under test, while solder balls 33 in BGA 36 may have a larger pitch PB (i.e. spacing between the balls) to mate with more widely spaced corresponding contacts or pads 24 (see FIGS. 3 and 4) on the circuit board 20. It will be appreciated that any combination of probe tip or solder ball pitch spacing and pattern may be provided depending on the application requirements.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the invention. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for assembling a probe card for conducting wafer level testing of semiconductor devices, the method comprising:
   supporting a first surface of a silicon membrane that includes a plurality of test probes;
   applying a compressible underfill on a second surface of the silicon membrane opposite the first surface;
   aligning the silicon membrane with a circuit board including testing circuitry;
   pressing the silicon membrane and second surface with underfill thereon against the circuit board; and
   curing the underfill.

2. The method of claim 1, further comprising a step of depositing a plurality of solder balls onto redistribution conductors formed on the second surface of the silicon membrane to form a ball grid array for electrically connecting the testing probes to the circuit board.

3. The method of claim 2, wherein the pressing step includes mating each solder ball with a corresponding contact pad on the circuit board.

4. The method of claim 3, further comprising a step of reflow soldering the solder balls to each corresponding contact pads on the circuit board.

5. The method of claim 1, wherein the probe card is assembled using a surface mount technology (SMT) machine.

6. The method of claim 1, wherein the step of supporting the first surface of the silicon membrane includes releasably attaching a glass wafer to the first surface.

7. The method of claim 6, further comprising a step of at least partially inserting a portion of the testing probes protruding from the first surface of the silicon membrane into a corresponding recess formed in the first surface of the glass wafer to protect the probe.

8. The method of claim 6, wherein the glass wafer is releasably attached to the silicon membrane with UV tape.

9. The method of claim 8, wherein the underfill is cured by exposing the underfill to UV light wherein the light releases the UV tape from the silicon membrane.

10. The method of claim 1, wherein the silicon membrane includes active test control circuitry embedded therein for conducting wafer level high frequency testing.

11. A method for assembling a probe card for conducting wafer level testing of semiconductor devices, the method comprising:
   providing a silicon membrane including a plurality of test probes and active test control circuitry embedded therein operable to conduct wafer level high frequency testing;
   temporarily supporting a first surface of the silicon membrane with a glass wafer;
   applying a compressible underfill on a second surface of the silicon membrane opposite the first surface;
   aligning the silicon membrane with a circuit board including testing circuitry;
   pressing the silicon membrane and second surface with underfill thereon against the circuit board;
   curing the underfill; and
   removing the glass wafer from the silicon membrane.

12. The method of claim 11, further comprising a step of depositing a plurality of solder balls onto redistribution conductors formed on the second surface of the silicon membrane to form a ball grid array for electrically connecting the testing probes to the circuit board.

13. The method of claim 12, wherein the pressing step includes mating each solder ball with a corresponding contact pad on the circuit board.

14. The method of claim 13, further comprising a step of reflow soldering the solder balls to each corresponding contact pad on the circuit board.

15. The method of claim 11, wherein the probe card is assembled using a surface mount technology (SMT) machine.

16. A method for assembling a probe card for conducting wafer level testing of semiconductor devices, the method comprising:
   providing a silicon membrane including a plurality of test probes each having a tip protruding therefrom;
   temporarily supporting a first surface of the silicon membrane with a glass wafer;
   forming a ball grid array on a second surface of the silicon membrane opposite the first surface;
   applying a compressible underfill on a second surface of the silicon membrane opposite the first surface;
   aligning the silicon membrane with a circuit board including testing circuitry;
   pressing the silicon membrane and second surface with underfill thereon against the circuit board;
   curing the underfill; and
   removing the glass wafer from the silicon membrane.

17. The method of claim 16, wherein the forming step includes depositing a plurality of solder balls onto redistribution conductors formed on the second surface of the silicon membrane to form the ball grid array for electrically connecting the testing probes to the circuit board.

18. The method of claim 17, wherein the pressing step includes mating each solder ball with a corresponding contact pad on the circuit board.

19. The method of claim 18, further comprising a step of reflow soldering the solder balls to each corresponding contact pad on the circuit board.

20. The method of claim 16, wherein the silicon membrane includes active test control circuitry embedded therein operable to conduct wafer level high frequency testing.

* * * * *